(12) United States Patent
Kim et al.

(10) Patent No.: US 12,358,262 B2
(45) Date of Patent: Jul. 15, 2025

(54) DISPLAY DEVICE AND METHOD OF MANUFACTURING THE SAME

(71) Applicant: SAMSUNG DISPLAY CO., LTD., Yongin-si (KR)

(72) Inventors: Youngdo Kim, Suwon-si (KR); Hyunseok Oh, Yongin-si (KR); Kang-Woo Lee, Seoul (KR); Sunghoon Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 559 days.

(21) Appl. No.: 17/668,505

(22) Filed: Feb. 10, 2022

(65) Prior Publication Data
US 2022/0376192 A1 Nov. 24, 2022

(30) Foreign Application Priority Data
May 24, 2021 (KR) .................. 10-2021-0066095

(51) Int. Cl.
*H10K 77/10* (2023.01)
*B32B 3/30* (2006.01)
(Continued)

(52) U.S. Cl.
CPC .............. *B32B 17/06* (2013.01); *B32B 3/30* (2013.01); *B32B 27/06* (2013.01);
(Continued)

(58) Field of Classification Search
CPC ...... H10K 77/111; H10K 77/10; B32B 17/06; G09F 9/301; G06F 1/1652
See application file for complete search history.

(56) References Cited

U.S. PATENT DOCUMENTS 9,354,476 B2   5/2016  Han et al.
10,020,462 B1 * 7/2018  Ai .................... H10K 59/871
(Continued)

FOREIGN PATENT DOCUMENTS

KR   10-2015-0000553 A   1/2015
KR   10-2018-0079093     7/2018
(Continued)

OTHER PUBLICATIONS

Office Action issued in corresponding application No. KR 10-2021-0066095 on Dec. 6, 2024.

*Primary Examiner* — Phat X Cao
(74) *Attorney, Agent, or Firm* — F. CHAU & ASSOCIATES, LLC

(57) ABSTRACT

A display device includes a display panel having a first non-folding area, a folding area connected to the first non-folding area, and a second non-folding area spaced apart from the first non-folding area by the folding area. A base member is disposed on the display panel. The base member includes a pattern area including a plurality of concave portions overlapping the folding area. The plurality of concave portions is spaced apart from each other in a first direction and has a depth in a second direction perpendicular to the first direction. A first filling layer fills the plurality of concave portions. The first filling layer includes at least one material selected from an acrylate, a urethane acrylate, and a silicone resin.

14 Claims, 11 Drawing Sheets

(51) Int. Cl.
  *B32B 17/06* (2006.01)
  *B32B 27/06* (2006.01)
  *B32B 38/00* (2006.01)
  *H10K 71/00* (2023.01)
  *H10K 102/00* (2023.01)

(52) U.S. Cl.
  CPC ......... *B32B 38/0008* (2013.01); *H10K 77/10* (2023.02); *H10K 77/111* (2023.02); *B32B 2255/10* (2013.01); *B32B 2255/26* (2013.01); *B32B 2310/14* (2013.01); *B32B 2457/20* (2013.01); *H10K 71/00* (2023.02); *H10K 2102/311* (2023.02)

(56) References Cited

U.S. PATENT DOCUMENTS

2014/0376162 A1   12/2014   Lim et al.
2022/0103672 A1*  3/2022    Jung ................ G02F 1/133331
2022/0195235 A1*  6/2022    Sunwoo ............. C08F 290/067

FOREIGN PATENT DOCUMENTS

KR   10-2018-0079093 A   7/2018
WO       2020228893 A1   11/2020

* cited by examiner

DISPLAY DEVICE AND METHOD OF MANUFACTURING THE SAME

CROSS-REFERENCE TO RELATED APPLICATION(S)

This application claims priority under 35 U.S.C. § 119 to Korean Patent Application No. 10-2021-0066095, filed on May 24, 2021 in the Korean Intellectual Property Office, the disclosure of which is incorporated by reference in its entirety herein.

1. TECHNICAL FIELD

Embodiments of the present inventive concept relate to a display device and a method of manufacturing the display device. More particularly, embodiments of the present inventive concept relate to a deformable display device and a method of manufacturing the display device.

2. DISCUSSION OF RELATED ART

A flat panel display device is a type of display device that has largely replaced cathode ray tube display devices due to characteristics such as being relatively light weight and thin. Representative examples of such flat panel display devices include a liquid crystal display device and an organic light emitting display device.

Display devices have recently been manufactured to have flexible characteristics, such as to be bendable or foldable. Such flexible display devices provide increased portability and user convenience.

However, when the flexible display device is repeatedly bent, the durability of the bending area may decrease. Similarly, when the flexible display device is repeatedly folded, the durability of the folding area may decrease.

SUMMARY

Embodiments of the present inventive concept may provide a foldable display device.

Embodiments of the present inventive concept may provide a method of manufacturing a foldable display device.

According to an embodiment of the present inventive concept, a display device includes a display panel having a first non-folding area, a folding area connected to the first non-folding area, and a second non-folding area spaced apart from the first non-folding area by the folding area. A base member is disposed on the display panel. The base member includes a pattern area including a plurality of concave portions overlapping the folding area. The plurality of concave portions is spaced apart from each other in a first direction and has a depth in a second direction perpendicular to the first direction. A first filling layer fills the plurality of concave portions. The first filling layer includes at least one material selected from an acrylate, a urethane acrylate, and a silicone resin.

In an embodiment, the first filling layer is also disposed in the pattern area on portions of the base member disposed outside of the plurality of concave portions.

In an embodiment, the first filling layer may be disposed to overlap the first non-folding area, the folding area, and the second non-folding area.

In an embodiment, the display device may further include a second filling layer disposed on the first filling layer.

In an embodiment, the second filling layer may include at least one material selected from an acrylate, a urethane acrylate and a silicone resin.

In an embodiment, the base member may include glass or polymer.

A method of manufacturing display device according to an embodiment may include removing a gas remaining on a base member through a first suction member, the base member including a pattern area including a plurality of concave portions spaced apart from each other in a first direction and having a depth in a second direction perpendicular to the first direction, after the first suction member removes the gas, applying a filling material onto the base member using a slot die and attaching the base member on a display panel including a first non-folding area, a folding area connected to the first non-folding area, and a second non-folding area spaced apart from the first non-folding area by the folding area.

In an embodiment, the pattern area of the base member may be attached to overlap the folding area of the display panel.

In an embodiment, the method may further include increasing a surface energy of the base member by performing a plasma treatment on the base member by a plasma generating device, before the first suction member removes the gas.

In an embodiment, the method may further include curing the filling material by a curing member to form a first filling layer, after applying the filling material on the base member.

In an embodiment, the method may further include applying the filling material on the first filling layer and curing the filling material applied on the first filling layer by the curing member to form a second filling layer, after forming the first filling layer.

In an embodiment, a gas remaining on the first filling layer is removed by a second suction member before applying the filling material on the first filling layer.

In an embodiment, the method may further include curing the filling material applied onto the base member by a curing member to form a first filling layer.

In an embodiment, the method may further include applying the filling material on the first filling layer and curing the filling material applied on the first filling layer by the curing member to form a second filling layer, after forming the first filling layer.

In an embodiment, the method may further include removing a gas remaining on the first filling layer by a second suction member, before applying the filling material on the first filling layer.

In an embodiment, the method may further include attaching a release film on the filling material and flattening the filling material by applying pressure to the release film by a pressure member, after applying the filling material on the base member.

In an embodiment, the method may further include curing the filling material by a curing member to form a filling layer and separating the release film from the filling layer.

In an embodiment, the method may further include

In an embodiment, pre-curing the filling material, separating the release film from the pre-cured filling material and curing the pre-cured filling material to form a filling layer.

In an embodiment, the filling material may include at least one material selected from an acrylate, a urethane acrylate and a silicone resin.

In an embodiment, the base member may include glass or polymer.

According to an embodiment of the present inventive concept, a display device includes a display panel including at least one non-folding area and at least one folding area. A base member is disposed on the display panel. The base member includes a pattern area including a plurality of concave portions overlapping the at least one folding area. The plurality of concave portions is spaced apart from each other in a first direction and has a depth in a second direction perpendicular to the first direction. A first filling layer fills the plurality of concave portions. The first filling layer is comprised of a first filling material. There is no void included between the first filling layer and the plurality of concave portions.

A method of manufacturing a display device according to an embodiment of the present inventive concept may include removing a gas remaining on a base member through a first suction member on the base member including a pattern area including a plurality of concave portions spaced apart in a first direction and having a depth in a second direction perpendicular to the first direction, after the first suction member sucks the gas, applying a filling material onto the base member using a slot die and attaching the base member on a display panel including a first non-folding area, a folding area connected to the first non-folding area, and a second non-folding area spaced apart from the first non-folding area by the folding area.

Accordingly, in the display device manufactured by the method of manufacturing the display device, a void may not occur between the filling layer formed of the filling material and the plurality of concave portions.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF EMBODIMENTS

Hereinafter, a display device and a method of manufacturing the display device in accordance with embodiments of the present inventive concept will be explained in detail with reference to the accompanying drawings.

Figure 1:
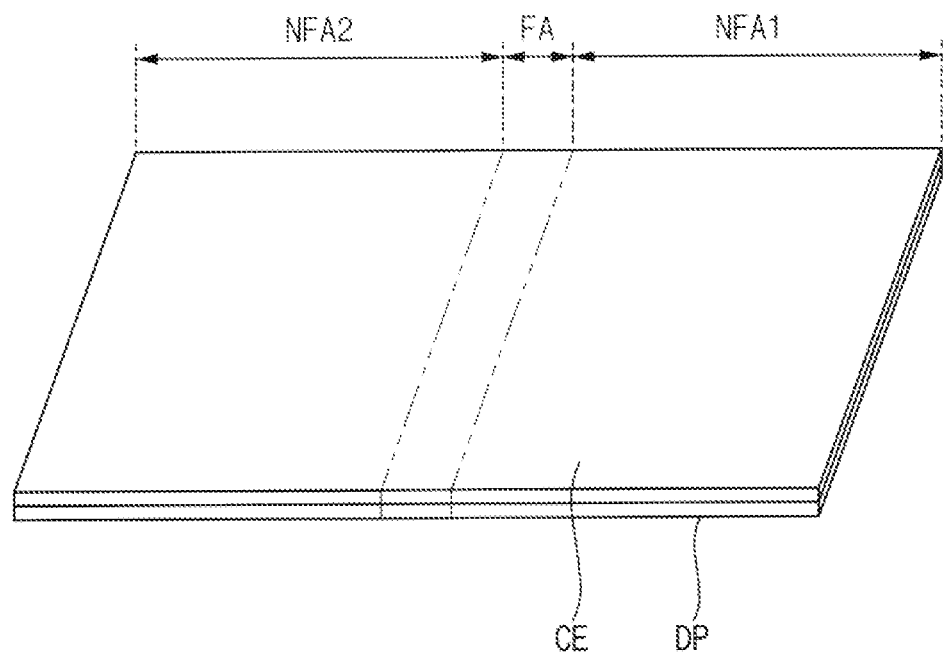
FIG. 1 is a perspective view illustrating an unfolded state of a foldable display device according to an embodiment of the present inventive concept.
Figure 2:
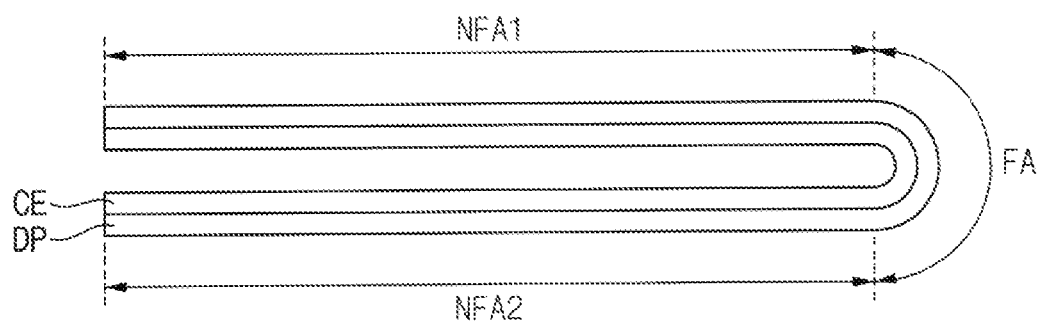
FIG. 2 is a cross-sectional view illustrating a display device of FIG. 1 in a folded state according to an embodiment of the present inventive concept.

FIG. 1 is a perspective view illustrating an unfolded state of a foldable display device according to an embodiment, and FIG. 2 is a cross-sectional view illustrating an embodiment in a state in which the display device of FIG. 1 is folded.

Referring to FIGS. 1 and 2, the display device may include a display panel DP and a cover member CE.

In an embodiment, the display panel DP may include a driving element layer, a light emitting layer, a thin film encapsulation layer, a sensing layer, an adhesive layer, and the like. The light emitting layer may include a light emitting element for emitting light, and the driving element layer may include driving element for driving the light emitting element.

The light emitting element and the driving element may be easily damaged by an external impact or foreign material. The cover member CE may be disposed on the display panel DP to protect the display panel DP from the external impact or the foreign material. Light emitted from the display panel DP may pass through the cover member CE and may be visually recognized by the user.

In an embodiment, the cover member CE may be made of a transparent material such as glass. The cover member CE may include a base member BE (FIG. 3) and a filling layer FM (FIG. 3) disposed on the base member. For example, in an embodiment, the base member BE may include ultra-thin glass. However, embodiments of the present inventive concept are not limited thereto. For example, the base member BE may include a polymer material having permeability. In an embodiment, the polymer material of the base member BE may include at least one material selected from transparent polyimide, polyethylene terephthalate, polyimide, polyethersulfone, polyacrylate, polyetherimide, polyethylene naphthalate, polyphenylene sulfide, polycarbonate, polymethyl methacrylate, or the like.

In an embodiment, the display device may include a first non-folding area NFA1, a folding area FA, and a second non-folding area NFA2. The folding area FA may be connected to the first non-folding area NFA1, and the second non-folding area NFA2 may be spaced apart from the first non-folding area NFA1 by the folding area FA. For example, the folding area FA may be disposed directly between the first non-folding area NFA1 and the second non-folding area NFA2. However, embodiments of the present inventive concept are not limited thereto and the number of the non-folding areas and folding areas included in the display device and the arrangement thereof may vary.

The display device may be folded or unfolded based on the flexibility of the folding area FA. For example, as shown in FIG. 2, the display device may be folded based on the flexibility of the folding area FA so that the first non-folding area NFA1 and the second non-folding area NFA2 may face each other. Also, the display device may be bent based on the folding area FA. For example, in the display device, the first non-folding area NFA1 and the second non-folding area NFA2 may be bent to have a predetermined angle with respect to each other.

Figure 3:
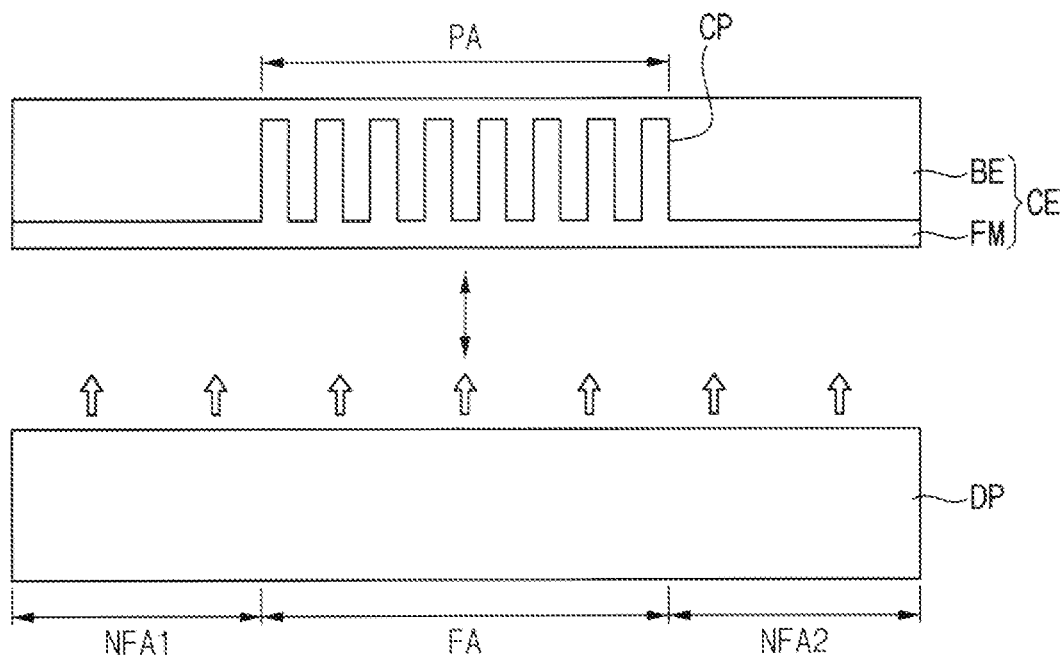
FIG. 3 is a cross-sectional view illustrating a cover member and a display panel included in the display device of FIG. 1 according to an embodiment of the present inventive concept.

FIG. 3 is a cross-sectional view illustrating an embodiment of a cover member and a display panel included in the display device of FIG. 1.

Referring to FIG. 3, the display panel DP may emit light. The light may pass through the cover member CE and be emitted to the outside for viewing by the user. The cover member CE may be attached to the display panel DP to protect the display panel DP.

In an embodiment, the display panel DP may include a first non-folding area NFA1, a folding area FA, and a second non-folding area NFA2. The cover member CE may include a base member BE and a filling layer FM. The base member BE may include a pattern area PA including a plurality of concave portions CP. The pattern area PA may overlap the folding area FA (e.g., in a thickness direction of the display device).

For example, the pattern area PA may be folded or unfolded together when the display panel DP is folded or unfolded. The base member BE may include a plurality of concave portions CP defined in the pattern area PA, thereby increasing impact resistance and folding characteristics.

A filling material may be filled in the plurality of concave portions CP. In an embodiment, the filling material may be cured after filling the plurality of concave portions CP to form the filling layer FM. For example, as shown in FIG. 3, the filling layer FM may be disposed within the plurality of concave portions CP and on a surface of the base member BE outside of the plurality of concave portions CP. In an embodiment, the filling material may include a material having a high elongation and a refractive index similar to those of the base member BE. For example, in an embodiment, a difference between the refractive index of the filling material and the refractive index of the base member BE may be about 0.01 or less.

In an embodiment, the base member BE may be composed of glass. In this embodiment, the filling material may include at least one material selected from acrylate, urethane acrylate, silicone resin, etc. However, embodiments of the present inventive concept are not limited thereto. For example, the filling material may be used in combination with a material that increases the refractive index. For example, the refractive index of the filling material may be lower than that of glass. In this embodiment, an organic material having a high refractive index or a metal having a high refractive index may be used to increase the refractive index of the filling layer FM. Examples of the organic material may include aromatic monomers and the like. Examples of the metal may include zirconium oxanide and titanium oxanide. Accordingly, a difference between the refractive index of the filling layer FM and the refractive index of the base member BE may be reduced.

Figure 4:
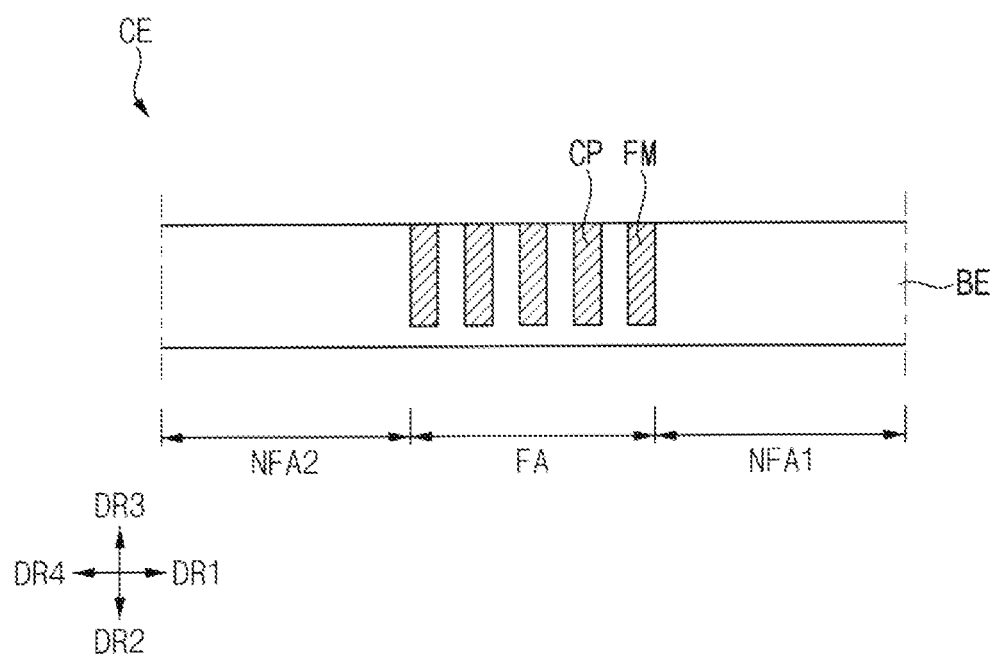
FIGS. 4, 5 and 6 are cross-sectional views illustrating an embodiment of a cover member included in the display device of FIG. 1 according to an embodiment of the present inventive concept.
Figure 5:
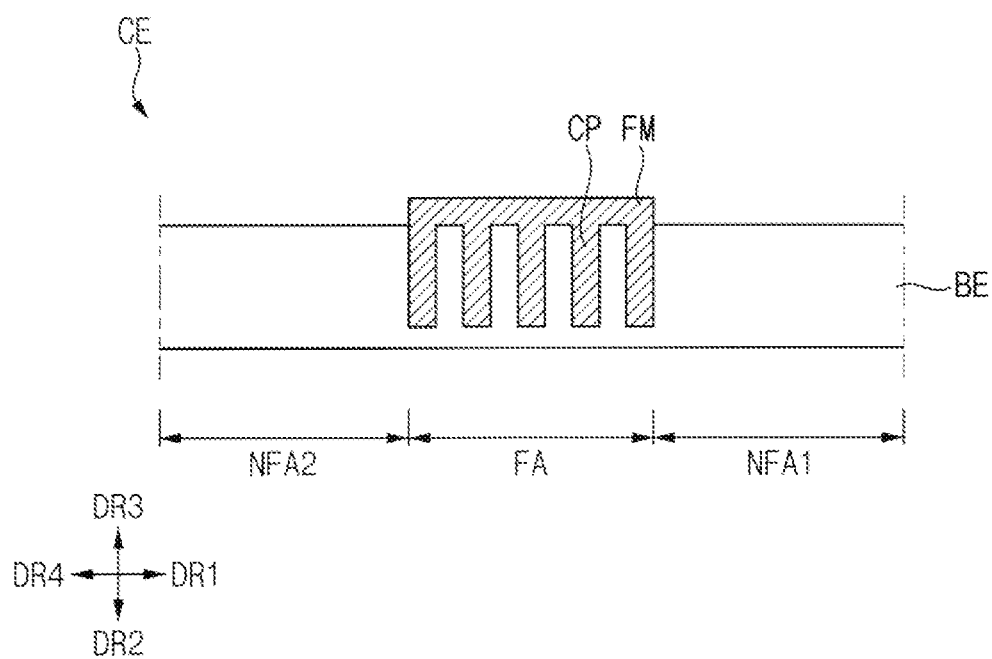
Figure 6:
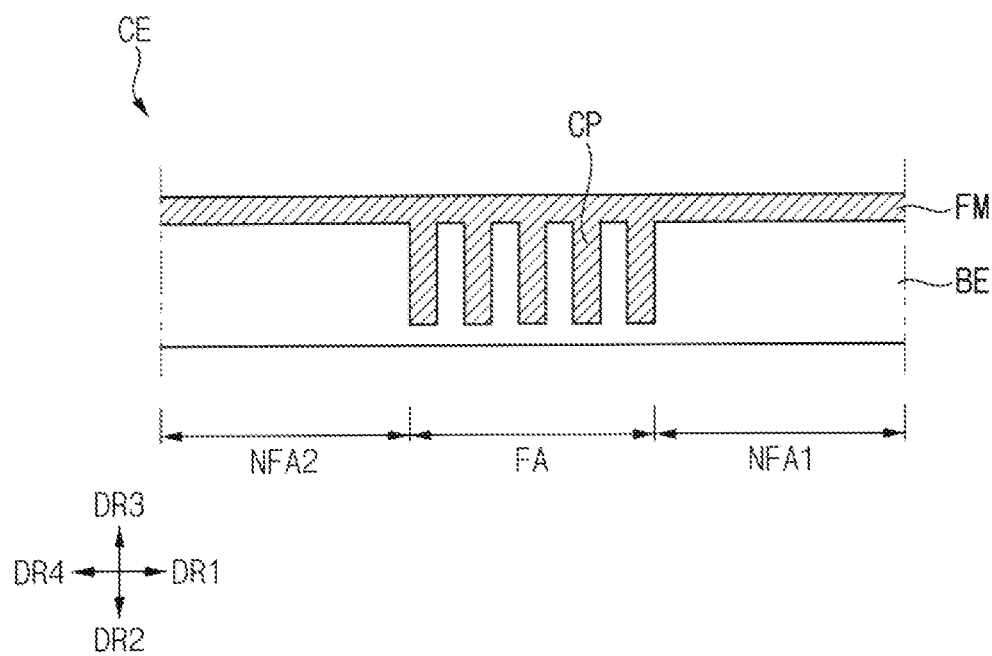

FIGS. 4, 5 and 6 are cross-sectional views illustrating embodiments of a cover member included in the display device of FIG. 1.

Referring to FIG. 4, the cover member CE may include a base member BE and a filling layer FM. The filling layer FM may be disposed to fill only a plurality of concave portions CP. For example, the filling layer FM may fill (e.g., completely fill) each of the plurality of concave portions CP but may not be disposed on a surface of the base member BE outside of the plurality of concave portions CP.

Referring to FIG. 5, the filling layer FM may fill the plurality of concave portions CP and may also be disposed on the a surface of the base member BE outside of the plurality of concave portions CP. For example, the filling layer FM may completely fill each of the plurality of concave portions CP and may be disposed above each of the plurality of concave portions CP and on an upper surface of the portion of the base member BE between adjacent concave portions of the plurality of concave portions CP in the folding area FA.

Referring to FIG. 6, the filling layer FM may fill the plurality of concave portions CP. Also, the filling layer FM may be disposed to overlap the first non-folding area NFA1, the folding area FA, and the second non-folding area NFA on the base member BE. For example, the filling layer FM may completely fill each of the plurality of concave portions CP and may be disposed above each of the plurality of concave portions CP and on upper surfaces of the base member BE in the folding area FA and the first and second non-folding areas NFA1, NFA2.

FIGS. 7, 8, 9, 10 and 11 are cross-sectional views illustrating embodiments of manufacturing a cover member included in the display device of FIG. 1.

Figure 7:
FIGS. 7, 8, 9, 10 and 11 are cross-sectional views illustrating a method of manufacturing a cover member included in the display device of FIG. 1 according to embodiments of the present inventive concept.
Figure 7:
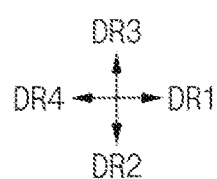
Figure 8:
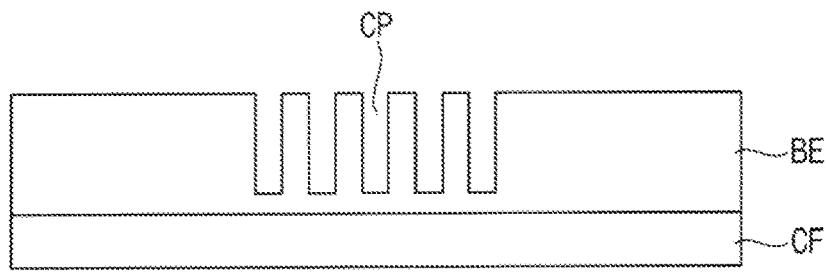
Figure 8:
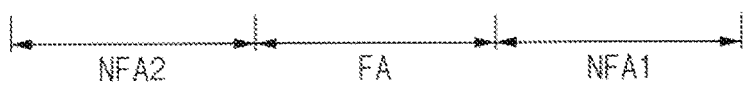
Figure 8:
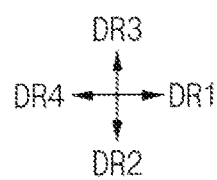

Referring to FIGS. 7 and 8, a carrier film CF and a patterned base member BE may be combined. For example, the carrier film CF may be attached to the patterned base member BE. In an embodiment, the carrier film CF may facilitate transport of the base member BE while the base member BE is processed, and may protect the base member BE from external impact. The carrier film CF may be separated from the base member BE later in the manufacturing process.

Figure 9:
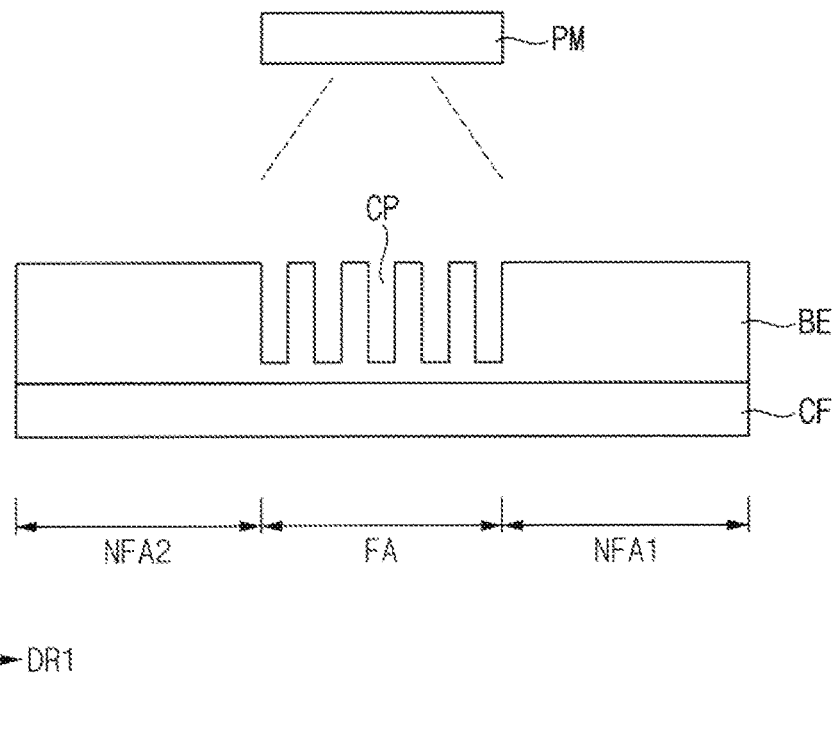

Referring to FIG. 9, plasma processing may be performed on the base member BE by using a plasma generating device PM to provide a plasma treatment. When plasma processing is performed, the base member BE may be cleaned. In addition, when the plasma treatment is performed, a surface energy of the base member BE may be adjusted. For example, the wettability of the filling material may be increased by increasing the surface energy of the base member BE so that the filling material may fill (e.g., completely fill) each of the plurality of concave portions CP. When the surface energy of the base member BE is increased, a contact angle between the filling material and the surface of the base member BE may be reduced. Accordingly, the filling material may fill the plurality of concave portions CP without voids.

Figure 10:
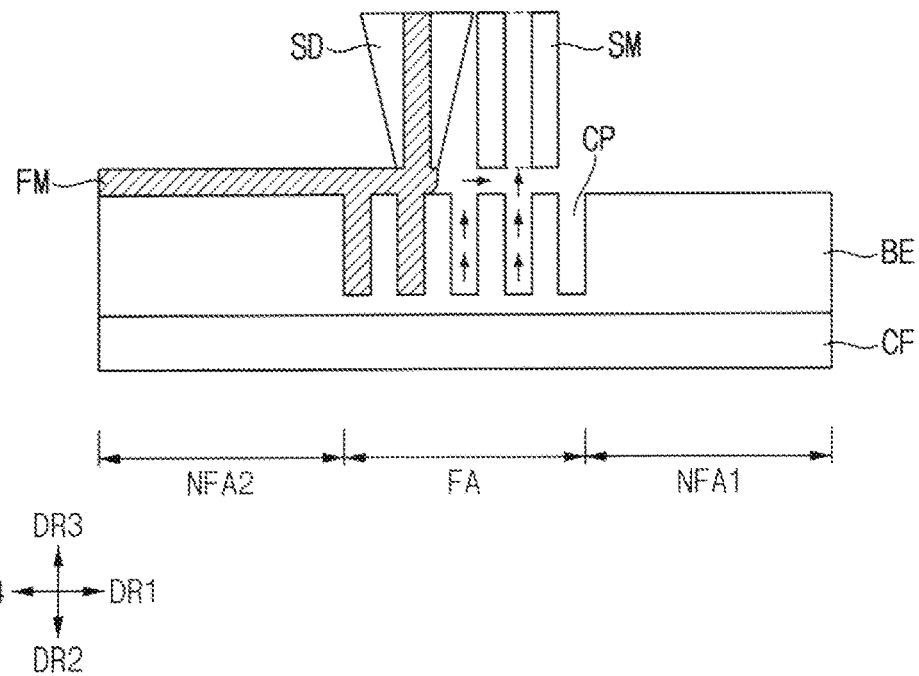

Referring to FIG. 10, a filling layer FM may be formed on the base member BE that has undergone the plasma processing. In an embodiment, a slot die SD may apply the filling material while moving in the first direction DR1. In an embodiment, the slot die SD may apply the filling material only to the plurality of concave portions CP. In this embodiment, the filling material may be applied in a second direction DR2 perpendicular to the first direction DR1. However, embodiments of the present inventive concept are not limited thereto. For example, in an embodiment, the slot die SD may also apply the filling material on portions of the base member BE outside of the plurality of concave portions CP while filling the plurality of concave portions CP and may apply the filling material above the plurality of concave portions CP. For example, the filling material may be applied on the base member BE to overlap only the folding area FA, or to overlap all of the first non-folding area NFA1, the folding area FA, and the second non-folding area NFA2.

When gas remains in the plurality of concave portions CP, a void may be formed as the filling material is applied. In this case, a refractive index difference may occur due to the presence of the void which may result in the refraction of light emitted from the display panel.

To prevent the presence of gas which may result in the formation of a void as the filling material is applied, the suction member SM may apply suction force to remove the gas remaining in the plurality of concave portions CP before the filling material is applied. For example, in an embodiment, the gas remaining in the plurality of concave portions CP may move in the third direction DR3 opposite to the second direction DR2 by the suction member SM for removal. Therefore, the removal of the remaining gas may prevent a void from being formed in the process of filling the concave portions CP with the filling material.

In an embodiment, the slot die SD may apply the filling material immediately after the suction member SM removes the gas remaining on the base member BE so that the filling material can be applied without creating a void.

Figure 11:
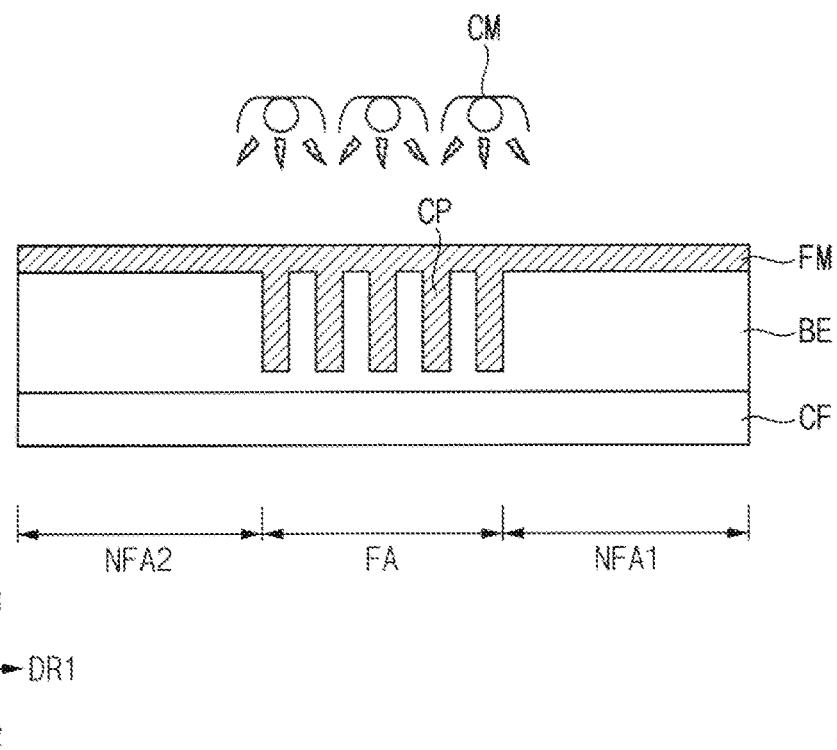

Referring to FIG. 11, a curing member CM may be used for curing. The filling material may be cured by the curing member CM to form the filling layer FM. In an embodiment, curing may be divided into temporary curing and main curing, or only main curing may be performed. The type of curing provided by the curing member CM may vary. For example, in an embodiment, curing may include thermosetting, photocuring, natural curing, and the like. Examples of the photocuring include UV curing using ultraviolet light. However, embodiments of the present inventive concept are not limited thereto.

The filling material may include at least one material selected from an acrylate, a urethane acrylate, a silicone resin, or the like.

The cover member CE, which has been cured, may be bonded to the display panel. In an embodiment, the cover member CE may be bonded to the display panel DP while the filling layer FM faces the display panel. In this embodiment, the cover member CE and the display panel DP may be bonded with the carrier film CF removed. In an embodiment, the cover member CE may be attached to the display panel DP so that the pattern area PA of the base member BE overlaps the folding area FA of the display panel DP.

The plurality of concave portions CP may be spaced apart from each other in the first direction DR1 and the base member BE may be disposed between adjacent concave portions of the plurality of concave portions CP. In an embodiment, each of the plurality of concave portions CP may be spaced apart from an adjacent concave portion of the plurality of concave portions CP by a distance in a range of about 200 micrometers or less in the first direction DR1. Also, a width of each of the plurality of concave portions CP in the first direction DR1 may be in a range of about 200 micrometers or less. The plurality of concave portions CP may have a depth in the second direction DR2 perpendicular to the first direction DR1. In an embodiment, each of the plurality of concave portions CP may have a depth in a range of about 110 to about 130 micrometers in the second direction DR2. In an embodiment, a thickness of the base member BE in the second direction DR2 may be about 150 micrometers. Accordingly, in regions in which the plurality of concave portions CP are formed, the base member BE may have a thickness in a range of about 20 to about 40 micrometers.

Figure 12:
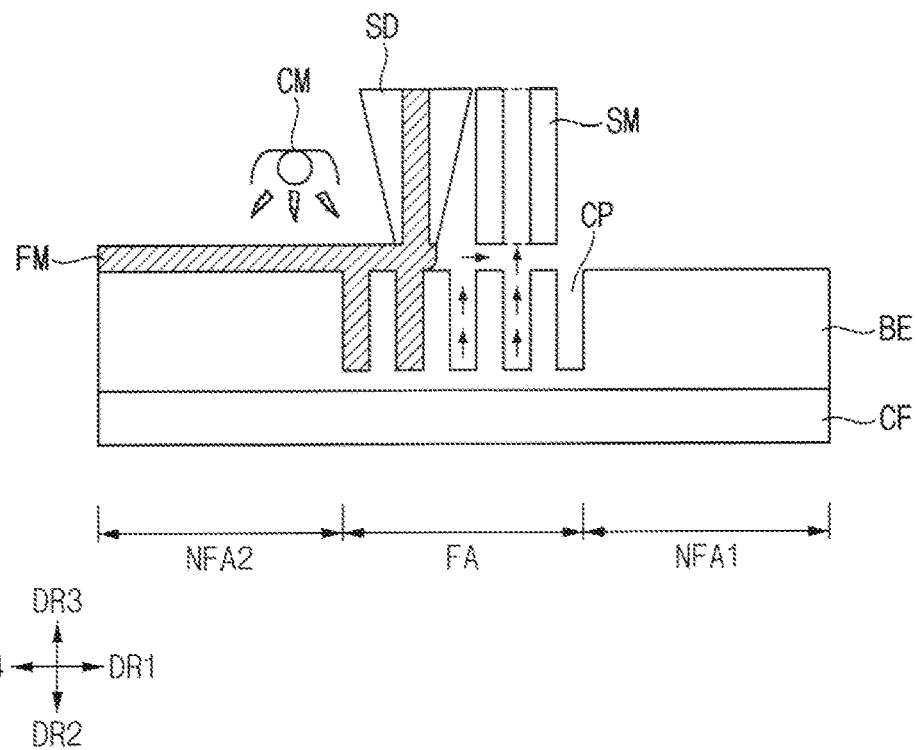
FIG. 12 is a cross-sectional view illustrating a method of manufacturing a cover member included in the display device of FIG. 1 according to an embodiment of the present inventive concept.

FIG. 12 is a cross-sectional view illustrating an embodiment in which a cover member included in the display device of FIG. 1 is manufactured.

Referring to FIG. 12, the suction member SM may apply suction force to remove the gas remaining on the base member BE, the slot die SD may apply the filling material, and the curing member CM may cure the filling material almost simultaneously. In this embodiment, the filling material is cured immediately after being applied, thereby suppressing the flow of the filling material. Accordingly, the filling layer FM may be formed to have increased flatness.

Figure 13:
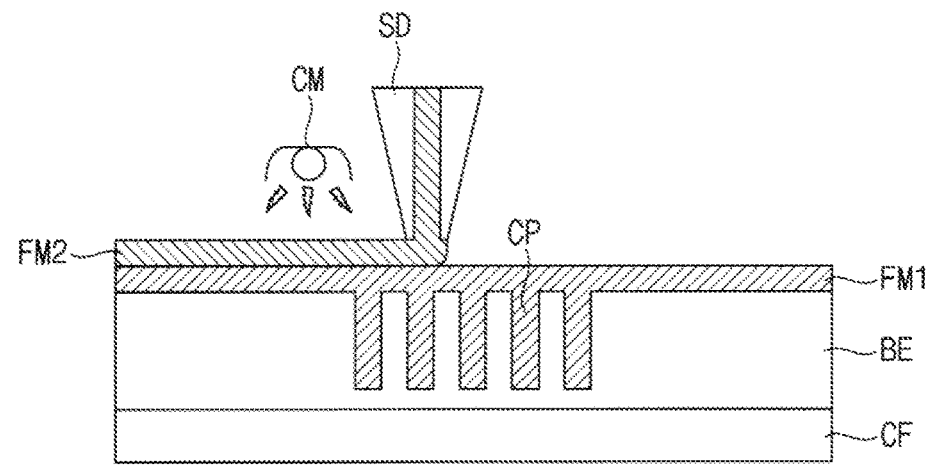
FIG. 13 is a cross-sectional view illustrating a method of manufacturing a cover member included in the display device of FIG. 1 according to an embodiment of the present inventive concept.

FIG. 13 is a cross-sectional view illustrating an embodiment in which a cover member included in the display device of FIG. 1 is manufactured.

Referring to FIG. 13, the cover member CE may include two filling layers comprising first and second filling layers FM1, FM2. The first filling layer FM1 may be formed by various methods as described above. In an embodiment, the flatness of the first filling layer FM1 may not be sufficiently secured. Accordingly, the slot die SD may apply additional filling material on the first filling layer FM1 to form a second filling layer FM2. The slot die SD may compensate for flatness in an area of the first filling layer FM1 having a low flatness. In an embodiment, the second filling layer FM2 may be applied on an entirety of the first filling layer FM1. However, embodiments of the present inventive concept are not limited thereto and the second filling layer FM2 may be applied on only a portion of the first filling layer FM1.

In an embodiment, the first filling layer FM1 may include at least one material selected from an acrylate, a urethane acrylate, a silicone resin, or the like. The second filling layer FM2 may also include at least one material selected from an acrylate, a urethane acrylate, a silicone resin, or the like. The first filling layer FM1 and the second filling layer FM2 may be formed of the same material or may be formed of different materials.

As described above, by forming the two filling layers comprising the first and second filling layers FM1, FM2, the flatness of the cover member CE may be increased.

As described above, the refractive index of each of the first filling layer FM1 and the second filling layer FM2 preferably has a refractive index in a range similar to that of the base member BE. For example, in an embodiment, the difference between the refractive index of the base member BE and the refractive index of each of the first and second filling layers FM1, FM2 may be in a range of about 0.01 or less. In an embodiment, an organic material or a metal capable of increasing the refractive index in addition to a material having a low refractive index may be used as the first filling layer FM1 and the second filling layer FM2 together. For example, a material having a high refractive index such as an aromatic monomer may be used together for the organic material. However, embodiments of the present inventive concept are not limited thereto. For example, in an embodiment, zirconium oxide, titanium oxide, or the like may be used together for the metal.

Figure 14:
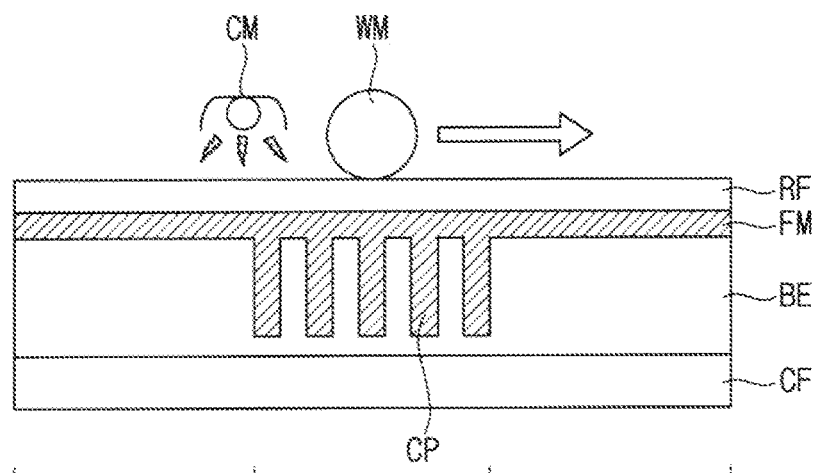
FIG. 14 is a cross-sectional view illustrating a method of manufacturing a cover member included in the display device of FIG. 1 according to an embodiment of the present inventive concept.

FIG. 14 is a cross-sectional view illustrating an embodiment in which a cover member included in the display device of FIG. 1 is manufactured.

Referring to FIG. 14, a release film RF may be attached to increase the flatness of the filling layer FM.

In an embodiment, the release film RF may be attached on (e.g., adhered to) the filling material after the filling material is applied on the base member BE. Thereafter, a pressure member WM may apply pressure to the release film RF to increase the flatness of the filling material. In an embodiment, the pressure member WM may be various members that are capable of applying pressure to the release film RF. For example, in an embodiment, the release film RF may be pressed using a roller for the pressure member WM. Thereafter, the curing member CM may cure the filling material to form the filling layer FM. The release film RF may then be removed. However, embodiments of the present inventive concept are not limited thereto. For example, in an embodiment, curing may proceed after the release film RF is removed.

In an embodiment, the release film RF may be attached on the filling layer FM after the filling layer FM is temporarily cured. The flatness of the filling layer FM may then be increased by applying pressure to the release film RF using the pressing member WM. Main curing may then be performed to form the filling layer FM. The release film RF may then be separated from the filling layer FM. However, embodiments of the present inventive concept are not limited thereto. For example, in an embodiment, after temporary curing is performed, the release film RF may be separated, and main curing may be performed on the filling layer FM.

Figure 15:
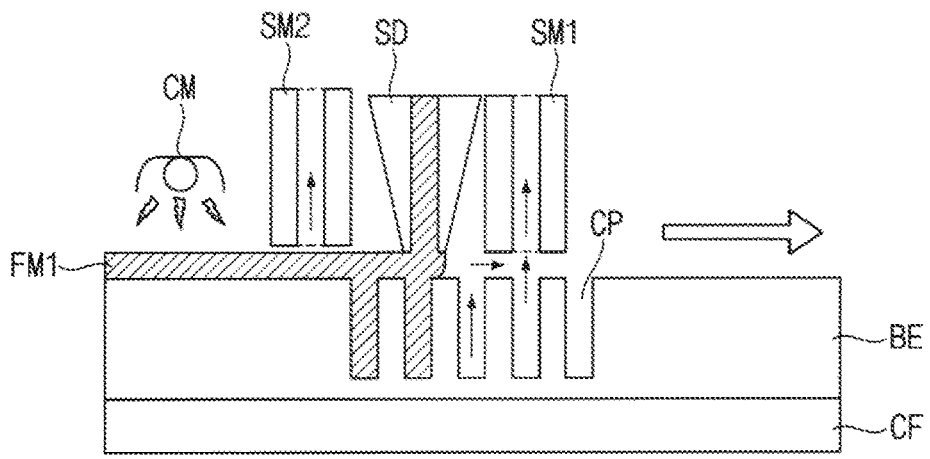
FIGS. 15 and 16 are cross-sectional views illustrating a method of manufacturing a cover member included in the display device of FIG. 1 according to embodiments of the present inventive concept.
Figure 16:
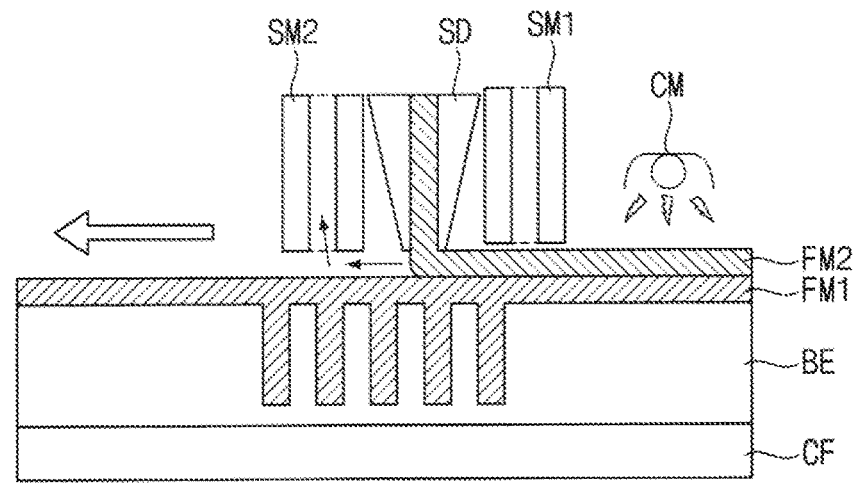

FIGS. 15 and 16 are cross-sectional views illustrating an embodiment in which a cover member included in the display device of FIG. 1 is manufactured.

Referring to FIGS. 15 and 16, the first suction member SM1 may move in the first direction DR1 to apply suction force to remove the gas remaining on the base member BE. The slot die SD may move in the first direction DR1 and apply the filling material to form the first filling layer FM1. Thereafter, the curing member CM may cure the filling material to form the first filling layer FM1.

Thereafter, as shown in FIG. 16, the second suction member SM2 may move in a fourth direction DR4 opposite to the first direction DR1 to apply suction force to remove the gas remaining on the first filling layer FM1. The slot die SD may apply the filling material on the first filling layer FM1. Thereafter, the curing member CM may cure the filling material to form the second filling layer FM2. As such, by sucking the gas remaining on the first filling layer FM1 even before forming the second filling layer FM2 using the second suction member SM2, a void may not be formed between the first filling layer FM1 and the second filling layer FM2.

Figure 17:
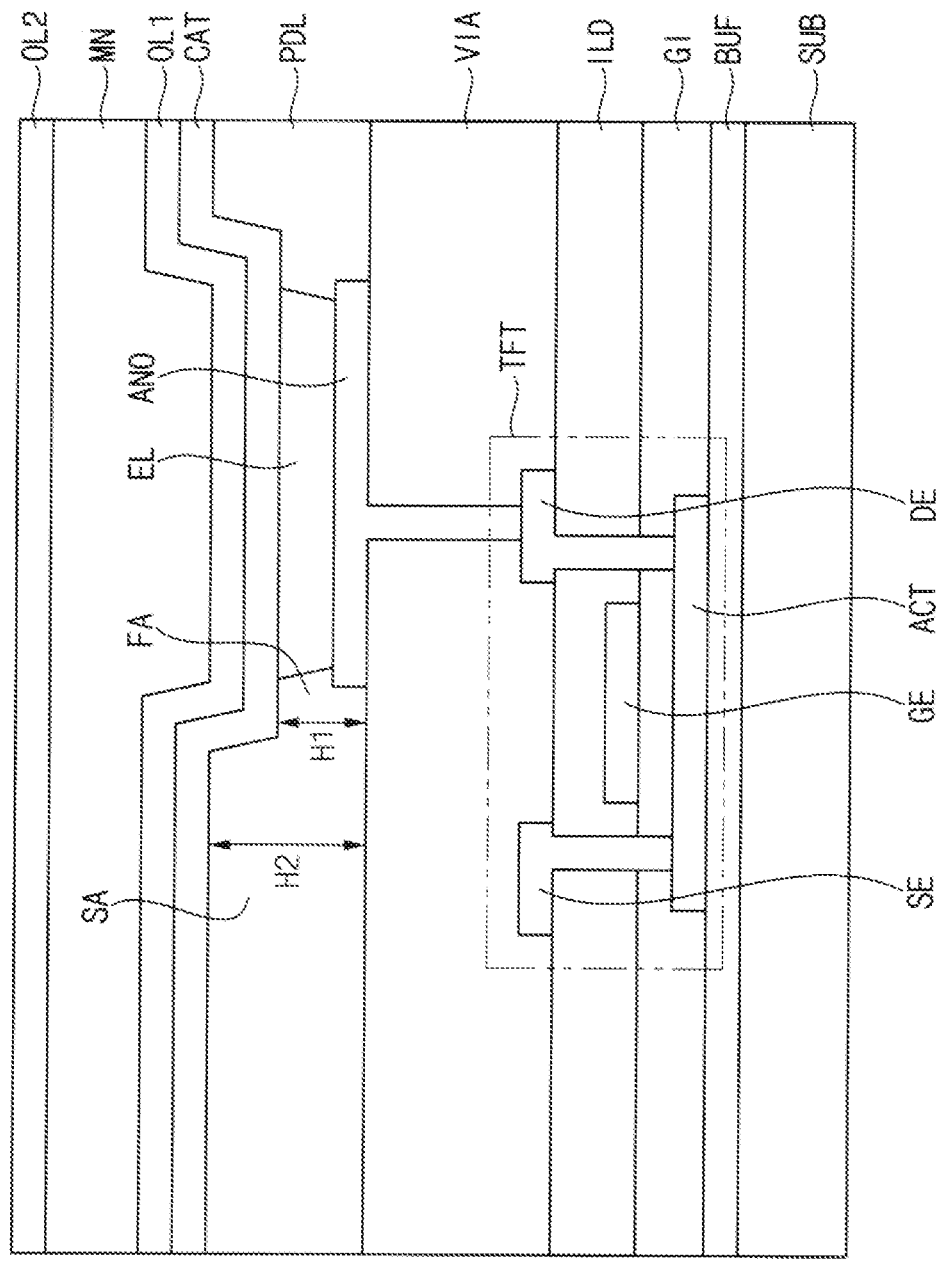
FIG. 17 is a cross-sectional view illustrating a display panel included in the display device of FIG. 1 according to an embodiment of the present inventive concept.

FIG. 17 is a cross-sectional view illustrating an embodiment of a display panel included in the display device of FIG. 1.

Referring to FIG. 17, in an embodiment, the display panel DP of FIG. 1 may include a substrate SUB, a buffer layer BUF, a transistor TFT, a gate insulating layer GI, an interlayer insulating layer ILD, a via insulating layer VIA, a pixel defining layer PDL, a light emitting diode and an encapsulation layer. The transistor TFT may include an active layer ACT, a gate electrode GE, a source electrode SE, and a drain electrode DE. The light emitting diode may include a first electrode ANO, a light emitting layer EL, and a second electrode CAT. The encapsulation layer may include a first inorganic encapsulation layer OL1, an organic encapsulation layer MN, and a second inorganic encapsulation layer OL2. However, embodiments of the present inventive concept are not limited thereto.

In an embodiment, the substrate SUB may be formed of a transparent or opaque material. For example, the substrate SUB may include at least one material selected from glass, quartz, plastic, or the like. However, embodiments of the present inventive concept are not limited thereto. In an embodiment, the substrate SUB may include polyimide PI. For example, in an embodiment, the substrate SUB may have a structure in which one or more polyimide layers and one or more barrier layers are alternately stacked.

The buffer layer BUF may be disposed on the substrate SUB. In an embodiment, the buffer layer BUF may prevent diffusion of metal atoms or impurities from the substrate SUB to the transistor TFT. In an embodiment, the buffer layer BUF may control a heat transfer rate during a crystallization process for forming the active layer ACT.

The active layer ACT may be disposed on the buffer layer BUF. In an embodiment, the active layer ACT may be formed of a silicon semiconductor or an oxide semiconductor. However, embodiments of the present inventive concept are not limited thereto.

Examples of the material that can be used for the silicon semiconductor may include at least one compound selected from amorphous silicon, polycrystalline silicon, or the like.

Examples of materials that can be used as the oxide semiconductor may include at least one compound selected from zinc oxide ("ZnOx"), gallium oxide ("GaOx"), titanium oxide ("TiOx"), tin oxide ("SnOx"), indium oxide ("InOx"), indium-gallium oxide ("IGO"), Indium-zinc oxide ("IZO"), indium-tin oxide ("ITO"), gallium-zinc oxide ("GZO"), zinc-magnesium oxide ("ZMO"), zinc-tin oxide ("ZTO"), zinc-zirconium oxide ("ZnZrxOy"), indium-Gallium-zinc oxide ("IGZO"), indium-zinc-tin oxide ("IZTO"), indium-gallium-hafnium oxide ("IGHO"), tin-aluminum-zinc oxide ("TAZO"), indium-gallium-tin oxide ("IGTO"), etc.

The gate insulating layer GI may cover the active layer ACT and be disposed on the buffer layer BUF. The gate insulating layer GI may be formed of an insulating material. Examples of the insulating material that can be used as the gate insulating layer GI may include at least one compound selected from silicon oxide ("SiOx"), silicon nitride ("SiNx"), silicon oxynitride ("SiON"), or the like.

The gate electrode GE may be disposed on the gate insulating layer GI. The gate electrode GE may be formed of a metal, an alloy, a conductive metal oxide, a transparent conductive material, or the like. Examples of materials that can be used as the gate electrode GE may include silver ("Ag"), an alloy containing silver, molybdenum ("Mo"), an alloy containing molybdenum, aluminum (Al), alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("ZO"), and the like. These may be used alone or in combination with each other.

The interlayer insulating layer ILD may cover the gate electrode GE and be disposed on the gate insulating layer GI. The interlayer insulating layer ILD may be formed of an insulating material.

The source electrode SE and the drain electrode DE may be disposed on the interlayer insulating layer ILD. The source electrode SE and the drain electrode DE may directly contact the active layer ACT. In an embodiment, the source electrode SE and the drain electrode DE may be formed of at least one material selected from a metal, an alloy, a conductive metal oxide, a transparent conductive material, or the like.

The via insulating layer VIA may cover the source electrode SE and the drain electrode DE, and be disposed on the interlayer insulating layer ILD. The via insulating layer VIA may be formed of an organic insulating material. In an embodiment, the via insulating layer VIA may include a least one material selected from photoresist, polyacrylic resin, polyimide resin, acrylic resin, or the like.

The first electrode ANO may be disposed on the via insulating layer VIA. The first electrode ANO may be connected to the drain electrode DE through a contact hole formed by removing a portion of the via insulating layer VIA. The contact hole may extend vertically through a portion of the via insulating layer VIA and may expose an upper surface of the drain electrode DE. In an embodiment, the first electrode ANO may be formed of at least one material selected from a metal, an alloy, a conductive metal oxide, a transparent conductive material, or the like. In an embodiment, the first electrode ANO may be an anode electrode.

The pixel defining layer PDL may be disposed on the via insulating layer VIA exposing the first electrode ANO. The pixel defining layer PDL may include an opening OP exposing the first electrode ANO. For example, in an embodiment, the pixel defining layer PDL may cover lateral ends of the first electrode ANO and may define an opening OP that exposes a central portion of the first electrode ANO. The pixel defining layer PDL may be formed of an organic material. In an embodiment, the pixel defining layer PDL may include at least one material selected from a photoresist, polyacrylic resin, polyimide resin, acrylic resin, or the like.

The pixel defining layer PDL may have a different height for each area. For example, the pixel defining layer PDL may have a first height H1 in the first area FA and a second height H2 in the second area SA. The second area SA may be connected to the first area FA. In an embodiment, the second height H2 may be greater than the first height HL. Accordingly, a step may be formed between the second area SA and the first area FA. In an embodiment, a step may be formed in the pixel defining layer PDL by using a halftone mask when forming the pixel defining layer PDL.

However, embodiments of the present inventive concept are not limited thereto. For example, in an embodiment, when forming the pixel defining layer PDL, a lower pixel defining layer having a first height H1 is first formed, and then the second height H2 of the second area SA and the first height H1 of the first area FA are formed. An upper pixel defining layer having a third height that is different from the first and second heights H1, H2 may be additionally formed. In this embodiment, the lower pixel defining layer and the upper pixel defining layer may be made of the same material or different materials.

The light emitting layer EL may be disposed on the first electrode ANO. The light emitting layer EL may contact the first electrode ANO in the opening OP. In an embodiment, the light emitting layer EL may include an organic light emitting layer emitting red light, an organic light emitting layer emitting green light, or an organic light emitting layer emitting blue light. In addition, the light emitting layer EL may further include a hole injection layer, a hole transport layer, an electron injection layer, and an electron transport layer.

The second electrode CAT may be disposed on the light emitting layer EL. The second electrode CAT may be disposed to cover the light emitting layer EL and the pixel defining layer PDL. In an embodiment, the second electrode CAT may be formed of at least one material selected from a metal, an alloy, a conductive metal oxide, a transparent conductive material, or the like. In an embodiment, the second electrode CAT may be a cathode electrode.

The encapsulation layer may be disposed on the second electrode CAT. For example, the first inorganic encapsulation layer OL1, the organic encapsulation layer MN, and the second inorganic encapsulation layer OL2 may be sequentially stacked (e.g., in a vertical direction). However, embodiments of the present inventive concept are not limited thereto and the encapsulation layer may have a structure in which a plurality of inorganic encapsulation layers and a plurality of organic encapsulation layers of various different numbers are stacked on each other in various different arrangements.

In an embodiment, the encapsulation layer may serve to prevent penetration of oxygen and/or moisture into the light emitting diode. The first inorganic encapsulation layer IL1 and the first inorganic encapsulation layer IL2 may be formed of an inorganic material. The organic encapsulation layer MN may be formed of an organic material.

Figure 18:
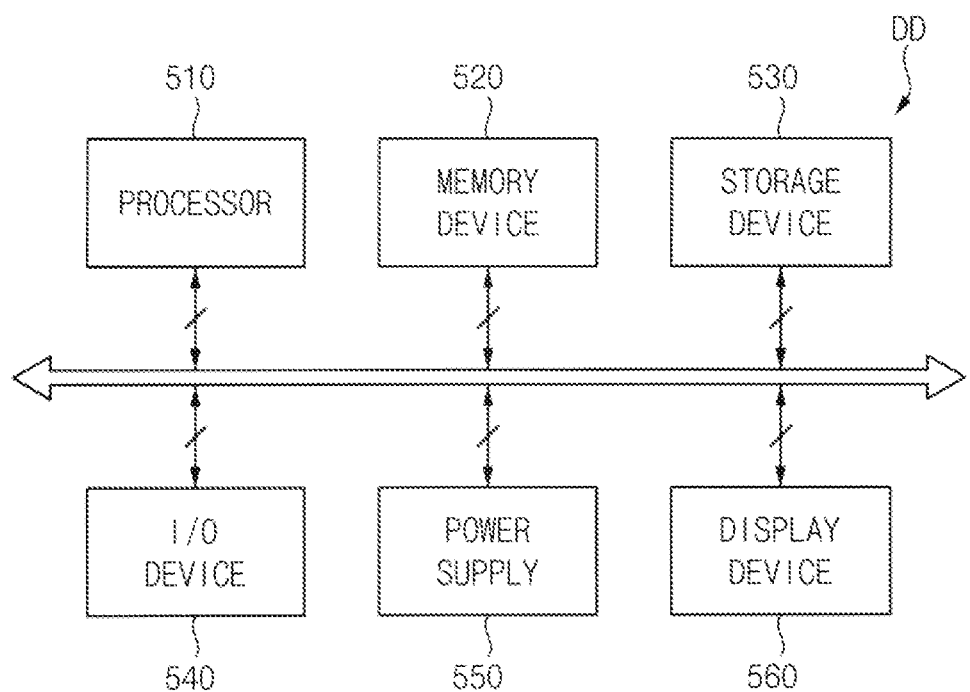
FIG. 18 is a block view illustrating an electronic device according to an embodiment of the present inventive concept.
Figure 19:
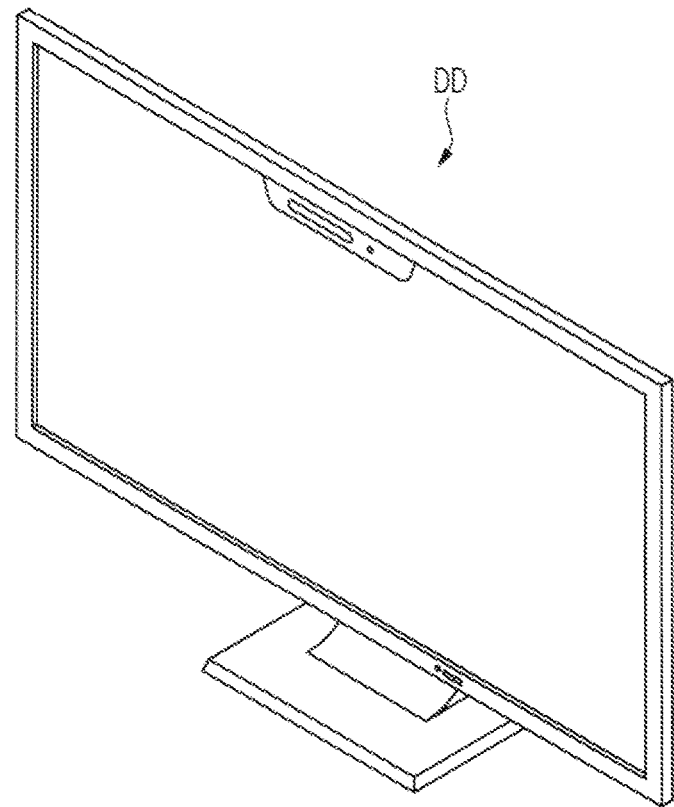
FIG. 19 is a perspective view of an electronic device of FIG. 18 implemented as a television according to an embodiment of the present inventive concept.
Figure 20:
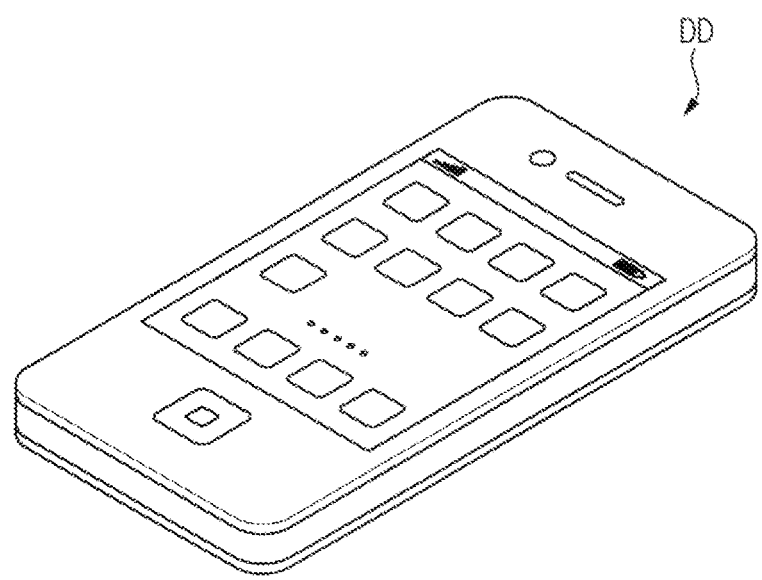
FIG. 20 is a perspective view of an electronic device of FIG. 18 implemented as a smartphone according to an embodiment of the present inventive concept.

FIG. 18 is a block view illustrating an electronic device according to an embodiment, FIG. 19 is a perspective view in which the electronic device of FIG. 18 is implemented as a television and FIG. 20 is a perspective view in which the electronic device of FIG. 18 is implemented as a smartphone.

Referring to FIGS. 18, 19 and 20, in an embodiment, an electronic device DD may include a processor 510, a memory device 520, a storage device 530, an input/output device 540, a power supply 550, and a display device 560. In this embodiment, the display device 560 may correspond to the display device described with reference to the aforementioned drawings. The electronic device DD may further include several ports capable of communicating with a video card, a sound card, a memory card, a USB device, and the like. In an embodiment, as illustrated in FIG. 19, the electronic device DD may be implemented as a television. However, embodiments of the present inventive concept are not limited thereto. For example, in an embodiment as illustrated in FIG. 20, the electronic device DD may be implemented as a smartphone. However, the electronic device DD may be various different small, medium or large scale electronic devices including a mobile phone, a video phone, a smart pad, a smart watch, a tablet PC, a vehicle navigation system, It may be implemented as a computer monitor, notebook computer, head mounted display (HMD), or the like.

The processor 510 may perform specific calculations or tasks. In an embodiment, the processor 510 may be a micro processor, a central processing unit (CPU), an application processor (AP), or the like. The processor 510 may be connected to other components through an address bus, a control bus, a data bus, or the like. In an embodiment, the processor 510 may also be connected to an expansion bus such as a peripheral component interconnect (PCI) bus.

The memory device 520 may store data necessary for the operation of the electronic device DD. For example, the memory device 520 may include nonvolatile memory device such as an erasable programmable read-only memory (EPROM) device, an electrically erasable programmable read-only memory (EEPROM) device, a flash memory device, and a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and/or volatile memory device such as a dynamic random access memory (DRAM) device, a static random access memory (SRAM) device, a mobile DRAM device.

The storage device 530 may include a solid state drive (SSD), a hard disk drive (HDD), a CD-ROM, or the like. The input/output device 540 may include an input means such as a keyboard, a keypad, a touch pad, a touch screen, and a mouse, and an output means such as a speaker and a printer.

The display device according to an embodiment of the present inventive concept may be applied to a display device included in a computer, a notebook, a mobile phone, a smartphone, a smart pad, a PMP, a PDA, an MP3 player, or the like.

Although the display devices and the method of manufacturing the display devices according to embodiments of the present inventive concept have been described with reference to the drawings, the illustrated embodiments are examples, and may be modified and changed by a person having ordinary knowledge in the relevant technical field without departing from the technical spirit of the present inventive concept. Accordingly, the scope of the present inventive concept should not be limited by the disclosed embodiments.

What is claimed is:

1. A method of manufacturing a display device, the method comprising:
    removing a gas remaining on a base member by a first suction member applying a suction force, the base member including a pattern area including a plurality of concave portions spaced apart from each other in a first direction and having a depth in a second direction perpendicular to the first direction;
    after the first suction member removes the gas, applying a filling material onto the base member using a slot die, the suction force applied by the first suction member is independent from forces generated by the applying of the filling material; and
    attaching the base member on a display panel including a first non-folding area, a folding area connected to the first non-folding area, and a second non-folding area spaced apart from the first non-folding area by the folding area.

2. The method of claim 1, wherein the pattern area of the base member is attached to overlap the folding area of the display panel.

3. The method of claim 1, further comprising, before the first suction member removes the gas,
    increasing a surface energy of the base member by performing a plasma treatment on the base member by a plasma generating device.

4. The method of claim 1, further comprising, after applying the filling material on the base member,
    curing the filling material by a curing member to form a first filling layer.

5. The method of claim 4, further comprising, after forming the first filling layer,
    applying the filling material on the first filling layer, and
    curing the filling material applied on the first filling layer by the curing member to form a second filling layer.

6. The method of claim 5, further comprising, before applying the filling material on the first filling layer,
    removing a gas remaining on the first filling layer by a second suction member applying a second suction force.

7. The method of claim 1, further comprising curing the filling material applied onto the base member by a curing member to form a first filling layer.

8. The method of claim 7, further comprising, after forming the first filling layer,
    applying the filling material on the first filling layer, and
    curing the filling material applied on the first filling layer by the curing member to form a second filling layer.

9. The method of claim 8, further comprising, before applying the filling material on the first filling layer,
    removing a gas remaining on the first filling layer by a second suction member applying a second suction force.

10. The method of claim 1, further comprising, after applying the filling material on the base member:
    attaching a release film on the filling material; and
    flattening the filling material by applying pressure to the release film by a pressure member.

11. The method of claim 10, further comprising:
    curing the filling material by a curing member to form a filling layer; and
    separating the release film from the filling layer.

12. The method of claim 10, further comprising:
    pre-curing the filling material;
    separating the release film from the pre-cured filling material; and
    curing the pre-cured filling material to form a filling layer.

13. The method of claim 1, wherein the filling material includes at least one material selected from an acrylate, a urethane acrylate and a silicone resin.

14. The method of claim 1, wherein the base member includes glass or polymer.

* * * * *